United States Patent [19]

Nawata et al.

[11] Patent Number: 4,618,398
[45] Date of Patent: Oct. 21, 1986

[54] DRY ETCHING METHOD

[75] Inventors: Makoto Nawata; Ryoji Fukuyama; Norio Nakazato; Masaharu Nishiumi, all of Kudamatsu, Japan

[73] Assignee: Hitachi, Ltd., Tokyo, Japan

[21] Appl. No.: 700,287

[22] Filed: Feb. 11, 1985

[30] Foreign Application Priority Data

Feb. 13, 1984 [JP] Japan .................................. 59-22805

[51] Int. Cl.$^4$ ............................ C23F 1/02; B44C 1/22; C03C 15/00; C03C 25/06
[52] U.S. Cl. ..................................... 156/643; 156/646; 156/656; 156/659.1; 156/665; 204/192.35; 252/79.1; 427/39
[58] Field of Search ............ 156/643, 646, 656, 659.1, 156/665; 252/79.1; 204/164, 192 EC, 192 E; 427/38, 39

[56] References Cited

U.S. PATENT DOCUMENTS 4,372,807  2/1983  Vossen et al. ................. 252/79.1 X
4,511,429  4/1985  Mizutani et al. ..................... 156/643

Primary Examiner—William A. Powell
Attorney, Agent, or Firm—Antonelli, Terry & Wands

[57] ABSTRACT

The present invention is concerned with a dry-etching method wherein a gaseous mixture of boron trichloride, chlorine and a hydrocarbon, to be used as an etching gas, is converted into plasma to etch aluminum or its alloys with ions or radicals formed thereby. The invention makes it possible to accomplish the anisotropic etching of aluminum or its alloys at high speeds with a low RF power density.

2 Claims, 2 Drawing Figures

DRY ETCHING METHOD

BACKGROUND OF THE INVENTION

1. Field of the Invention

The present invention relates to a dry etching method, and particularly to a dry etching method for accurate anisotropic etching of aluminum or its alloys at high speeds.

2. Description of the Prior Art

Aluminum or its alloys that form electrodes and wirings of semiconductor integrated circuits are dry-etched by using, as an etching gas, a gaseous mixture of boron trichloride (hereinafter referred to as $BCl_3$), chlorine (hereinafter referred to as $Cl_2$), methyl trichloride (hereinafter referred to as $CHCl_3$) and helium (hereinafter referred to as He) as disclosed in, for example, R. H. Bruce et al., J. Electrochem. Soc., Vol. 130, No. 6, pp. 1369–1372 (1983.6), or by using a gaseous mixture of $BCl_3$, $Cl_2$, silicon tetrachloride (hereinafter referred to as $SiCl_4$) and He as disclosed in R. F. Reicheldefer, Solid State Technology, Vol. 15, No. 6, pp. 64–75 (1982.6)

When aluminum or its alloys are dry-etched using, as an etching gas, the gaseous mixture of $BCl_3$, $Cl_2$, $CHCl_3$ and He, or that of $BCl_3$, $Cl_2$, $SiCl_4$ and He, the etching can be accomplished at a high speed and anisotropically free from undercutting. To accomplish the anisotropic etching at a high speed, however, the RF power density (RF power divided by electrode area, the unit being in $W/cm^2$) must be maintained at as high as, for instance, 1.8 $W/cm_2$ when the mixture of $BCl_3$, $Cl_2$, $CHCl_3$ and He is used as an etching gas, or 2.2 to 3 W/cm2 when the mixture of $BCl_3$, $Cl_2$, $SiCl_4$ and He is used as an etching gas. Therefore, when anisotropically etching aluminum or its alloys at high speeds using, as an etching gas, the gaseous mixture of $BCl_3$, $Cl_2$, $CHCl_3$ and He, or that of $BCl_3$, $Cl_2$, $SiCl_4$ and He, the capacity of the RF power source must be increased, and photoresist applied onto the surface of a semiconductor substrate to be etched, is liable to be damaged and thus an anisotropic etching with a small line-width loss, i.e., an accurate anisotropic etching, will not be readily accomplished.

SUMMARY OF THE INVENTION

An object of the present invention is to provide a dry etching method which makes it possible to accomplish a high speed and accurate anisotropic etching of aluminum or its alloys.

According to the present invention, a gaseous mixture of $BCl_3$, $Cl_2$ and hydrocarbon, where the ratio of the content of the $Cl_2$ to the sum of the contents of the $BCl_3$ and $Cl_2$ is 40 to 80% by volume and the ratio of the content of the hydrocarbon to be added to the sum of the contents of the $BCl_3$ and $Cl_2$ is 5 to 30% by volume, is used as an etching gas, and the etching gas is converted into plasma to etch aluminum or its alloys with plasma and thereby the present invention makes it possible to accomplish a high speed and accurate anisotropic etching of aluminum and its alloys. Namely, according to the present invention, aluminum or its alloys can be anisotropically etched at high speeds with a low RF power density.

DESCRIPTION OF THE PREFERRED EMBODIMENT

Figure 1:
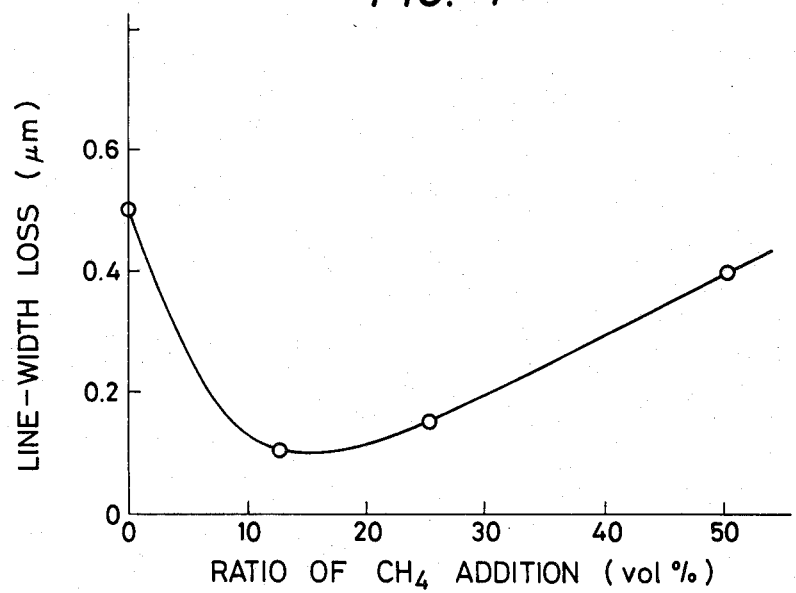
FIG. 1 pertains to the anisotropy of etching for aluminum according to the method of the present invention and shows a relationship between the ratio of addition of methane as a hydrocarbon to the gaseous mixture of $BCl_3$ and $Cl_2$ and the line-width loss (=width of photoresist before the etching - width of aluminum pattern after the etching), and FIG. 2 pertains to the high speed characteristics of aluminum etching and shows a relationship between the ratio of methane addition and the etching speed.
Figure 2:
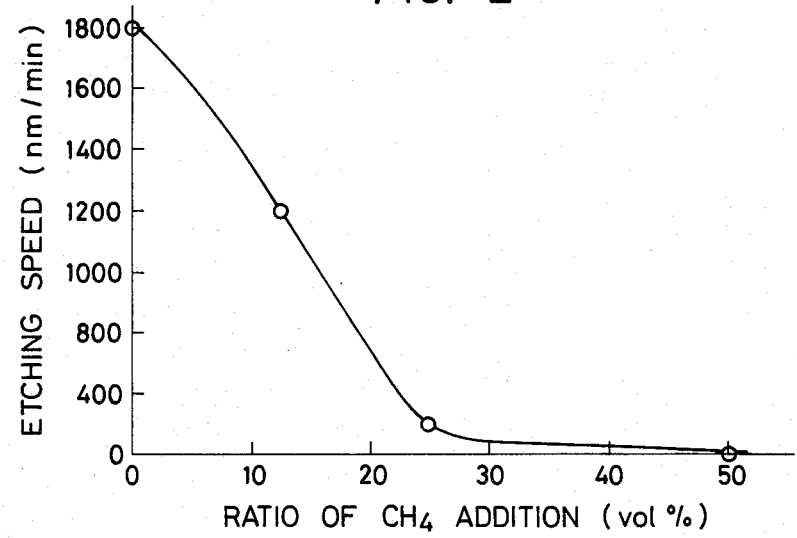

Aluminum, Al-Si alloy, and Al-Si-Cu alloy were etched while varying the flow rate of hydrocarbon gas added to the gaseous mixture of $BCl_3$ and $Cl_2$ under the conditions of a RF power density of 0.7 to 1.5 $W/cm^2$ and a ratio of $Cl_2$ flow rate to the resultant flow rate of $BCl_3$ and $Cl_2$ (hereinafter referred to as $Cl_2$ ratio) of 40 to 80% by volume. A semiconductor substrate of which the surface to be etched had been patterned with a photoresist was placed on one of a pair of electrodes disposed in an evacuated processing chamber and a RF power of 13.56 MHz was applied to the electrode on which the substrate had been placed. The results obtained were as shown in FIGS. 1 and 2, wherein the semiconductor substrate was composed of aluminum, the RF power density was 1.0 $W/cm^2$, and the $Cl_2$ ratio was 50% by volume (the resultant flow rate of $BCl_3$ and $Cl_2$ being 80 SCCM). Methane (hereinafter referred to as $CH_4$) was used as a hydrocarbon gas.

When no $CH_4$ is added in FIG. 1, i.e., when only a gaseous mixture of $BCl_3$ and $Cl_2$ is used, the dimension of wiring is narrowed due to the development of undercutting; i.e., the line-width loss amounts to as great as 0.5 $\mu$m to reduce the accurate anisotropy. On the other hand, the development of undercutting is decreased and the line-width loss is reduced, as the $CH_4$ gas is added at an increased flow rate to the mixture of $BCl_3$ and $Cl_2$, i.e., as the ratio of the $CH_4$ gas flow rate to the amount of the gaseous mixture of $BCl_3$ and $Cl_2$ (hereinafter referred to as the ratio of $CH_4$ addition) increases. The line-width loss becomes minimal, i.e., 0.1 $\mu$m, and the accurate anisotropy is sufficiently accomplished when the flow rate of $CH_4$ gas is about 10 SCCM, i.e., when the accurate ratio of $CH_4$ addition is about 13% by volume. If the flow rate of $CH_4$ gas is further increased, i.e., if the ratio of $CH_4$ addition is further increased, the line-width loss rather increases due to the regression of the photoresist though the accurate anisotropy of etching is still maintained. Thus, the line-width loss amounts to about 0.3 $\mu$m when the flow rate of $CH_4$ gas is 40 SCCM, i.e., when the ratio of $CH_4$ addition is 50% by volume.

In FIG. 2, the etching speed is as high as about 1800 nm/min when no $CH_4$ is added, i.e., when the mixture consisting of only $BCl_3$ and $Cl_2$ is used. On the other hand, the etching speed decreases as the flow rate of $CH_4$ gas increases, i.e., as the ratio of $CH_4$ addition increases. For instance, the etching speed is about 1200 nm/min when the flow rate of $CH_4$ gas is 10 SCCM, i.e., when the ratio of $CH_4$ addition is about 13% by volume, about 200 nm/min when the flow rate of $CH_4$ gas is 20 SCCM, i.e., when the ratio of $CH_4$ addition is 25% by volume, and about 20 nm/min when the flow rate of $CH_4$ gas is 40 SCCM, i.e., when the ratio of $CH_4$ addition is 50% by volume.

As shown in FIGS. 1 and 2, the line-width loss can be suppressed to 0.1 $\mu$m and the etching speed can be increased to about 1200 nm/min to effect the anisotropic etching at a high speed with a RF power density of as low as 1.0 W/cm$^2$ when the flow rate of CH$_4$ gas is set at about 10 SCCM, i.e., when the ratio of CH$_4$ addition is set at 13% by volume.

To accomplish the anisotropic etching of aluminum or its alloys at high speeds under the conditions of a RF power density of 0.7 to 1.5 W/cm$^2$ and a Cl$_2$ ratio of 40 to 80% by volume, the ratio of CH$_4$ addition must be properly selected depending upon the pressure in the processing chamber during etching and the distance between the electrodes. For example, when the pressure in the processing chamber is 20 to 60 Pa and the distance between the electrodes is 20 to 50 mm, the ratio of CH$_4$ addition should be selected to lie within a range of 5 to 30% by volume.

According to this embodiment, the etching of aluminum and its alloys can be accomplished with such a low RF power density as 0.7 to 1.5 W/cm$^2$ and damage to the photoresist can be restrained and, therefore, at a high speed an accurate anisotropic etching of aluminum and its alloys can be accomplished and the capacity of the RF power source can also be reduced.

In this embodiment, also, CH$_4$ is used as a hydrocarbon that is to be added to the gaseous mixture of BCl$_3$ and Cl$_2$. However, the same effects can also be obtained even when C$_2$H$_6$, C$_3$H$_8$, C$_2$H$_2$, C$_2$H$_4$, or C$_3$H$_4$ is used.

The above-described embodiment has been described with reference to an etching apparatus where a processing chamber with a pair of electrodes and a RF power is applied to one of the electrodes on which a sample is to be placed. It will be appreciated that such effects as described in this embodiment will be accomplished by other type of plasma etching apparatus.

According to the present invention as described above, a gaseous mixture of BCl$_3$, Cl$_2$ and hydrocarbon, to be used as an etching gas, is converted into plasma to etch aluminum or its alloys with ions or radicals formed thereby. Therefore, aluminum or its alloys can be anisotropically etched at high speeds with a low RF power density.

What is claimed is:

1. A dry etching method wherein a gaseous mixture of boron trichloride, chlorine and hydrocarbon, where the ratio of the content of the chlorine to the sum of the contents of the boron trichloride and the chlorine is 40 to 80% by volume and the ratio of the content of the hydrocarbon to the sum of the contents of boron trichloride and chlorine is 5 to 30% by volume, is used as an etching gas, and said etching gas is converted into plasma to etch aluminum or its alloys with said plasma.

2. A dry etching method according to claim 1, wherein methane is used as said hydrocarbon.

* * * * *